United States Patent
Cole

[11] Patent Number: 5,328,582
[45] Date of Patent: Jul. 12, 1994

[54] OFF-AXIS MAGNETRON SPUTTER DEPOSITION OF MIRRORS

[75] Inventor: Barrett E. Cole, Bloomington, Minn.

[73] Assignee: Honeywell Inc., Minneapolis, Minn.

[21] Appl. No.: 986,834

[22] Filed: Dec. 4, 1992

[51] Int. Cl.$^5$ .............................................. C23C 14/34
[52] U.S. Cl. ........................ 204/192.12; 204/298.11; 204/298.15; 204/298.26; 204/298.27
[58] Field of Search ............... 204/192.12, 298.11, 204/298.15, 298.19, 298.23, 298.26, 298.27, 298.28

[56] References Cited

U.S. PATENT DOCUMENTS

| | | | |
|---|---|---|---|
| 3,878,085 | 4/1975 | Corbani | 204/298 |
| 4,041,353 | 8/1977 | Penfold et al. | 315/267 |
| 4,100,055 | 7/1978 | Rainey | 204/298 |
| 4,221,652 | 9/1980 | Kuriyama | 204/298 |
| 4,297,189 | 10/1981 | Smith, Jr. et al. | 204/192 SP |
| 4,361,472 | 11/1982 | Morrison, Jr. | 204/192 R |
| 4,401,539 | 8/1983 | Abe et al. | 204/192 R |
| 4,415,427 | 11/1983 | Hidler et al. | 204/298 |
| 4,428,810 | 1/1984 | Webb et al. | 204/192 P |
| 4,512,284 | 4/1985 | Robinson et al. | 118/723 |
| 4,798,663 | 1/1989 | Herklotz et al. | 204/298.27 X |
| 4,851,095 | 7/1989 | Scobey et al. | 204/298.27 X |
| 4,865,709 | 9/1989 | Nakagawa et al. | 204/192.12 |
| 4,895,631 | 1/1990 | Wirz et al. | 294/192.13 |
| 4,902,671 | 2/1990 | Koinuma et al. | 204/192.24 X |
| 4,963,524 | 10/1990 | Yamazaki | 204/192.24 X |
| 5,084,151 | 1/1992 | Vallana et al. | 204/192.14 X |
| 5,124,013 | 6/1992 | Seddon et al. | 204/298.27 X |

FOREIGN PATENT DOCUMENTS 0074648  4/1984  Japan .............................. 204/298.27

*Primary Examiner*—Nam Nguyen
*Attorney, Agent, or Firm*—Craig J. Lervick

[57] ABSTRACT

A magnetron sputtering apparatus can be used to achieve high quality coating on substrates if the substrates are positioned adjacent to the sputtering target. Furthermore, the coating can be enhanced if the substrate is rotated in a planetary manner about the sputtering target. This device can be used in the production of high quality mirrors if the device allows for alternating coatings of different materials.

21 Claims, 4 Drawing Sheets

OFF-AXIS MAGNETRON SPUTTER DEPOSITION OF MIRRORS

FIELD OF THE INVENTION

The following invention teaches a method and apparatus for coating substrates with thin films of material. More specifically, the invention discloses a method and apparatus for the fabrication of high quality mirrors by coating a substrate with a plurality of materials which will affect the reflective properties of the substrate surface.

BACKGROUND OF THE INVENTION

Sputter deposition of materials has been widely used in the past for a number of applications including semiconductors, superconductors, and optical coatings. This sputter deposition has been accomplished through the use of DC diode sputtering, RF diode sputtering, RF magnetrun sputtering and other sputtering methods.

Typically, sputtering is accomplished by first establishing a gas discharge within a chamber. This gas discharge causes ions to be accelerated towards the cathode and eventually collide with the cathode surface. This collision with the cathode surface causes ion particles to be released from that surface and deposited on other surfaces in close proximity to the cathode. A substrate is typically placed close to the cathode and thus can be coated with the ion particles released from the cathode.

Magnetron sputtering is achieved by placing a magnet assembly behind the cathode. This magnet assembly can contain the plasma that is created by the gas discharge. Control of the plasma is very beneficial since it often maximizes the use of the cathode surface. By varying the design and configuration of the magnet assembly, depletion of the target surface can thus be controlled and maximized. In a typical gas discharge a plasma is created directly in front of the cathode. The plasma typically takes on an overall positive charge. A space is created between the plasma and the cathode surface which is free from electric charge. When electrons collide with the cathode surface, occasionally negatively charged ions are released. These negatively charged ions are accelerated across the dark space toward the plasma, due to the charge of the plasma. Subsequently the ions are accelerated through the plasma and collide with any objects that are situated behind this plasma. Due to the high rate of acceleration and large amount of energy, these ions can cause destruction or disturbance to a coated surface when they collide with that surface.

Sputter deposition is often used to produce high quality optical mirrors. When sputtering is used for this purpose, alternating layers of thin films are required to be deposited on a substrate. Therefore, it is necessary to sputter a first material to a certain thickness upon a substrate, and subsequently sputter a second material to a desired thickness on the same substrate. This sequence is then repeated for as many times as desired.

The need for alternating layers of sputtered material creates a problem in typical sputtering apparatus. The different materials must be sputtered onto the same substrate without unnecessarily handling the substrates themselves. Also, constant handling and changing of the target material is undesirable since that requires opening and closing of the gas filled chamber.

One approach has been to have numerous targets within one chamber and position the substrate in front of the appropriate target. While this method does allow for alternating coatings, the problem of direct, high energy collisions still exists. Additionally, the number of mirrors that can be produced concurrently is limited.

SUMMARY OF THE INVENTION

It is an object of the present invention to provide an apparatus for the production of high quality optical mirrors. It is a further object of the present invention to provide an apparatus that will produce these optical mirrors through sputter deposition whereby the substrates are placed adjacent to the sputtering targets. Placing the substrates in this position reduces the destructive effects of the high energy ions that are accelerated across the dark space and through the plasma of the gas discharge.

It is a further object of the present invention to provide a system for mass production of optical mirrors. This system includes apparatus by which two or more different materials may be sputtered onto a substrate in alternating layers.

In the present invention a magnetron sputtering device is used to sputter material from a target surface. However the substrates are placed adjacent and perpendicular to the target surface. Although positioning the substrates in this manner causes the deposition rate to be significantly lower a much higher quality thin film is deposited upon the substrate.

Higher quality thin films are obtained because the substrate surface is not bombarded with extremely high energy ions which are ejected from the target surface. As previously stated, charged ions which are ejected from the target surface are accelerated across a dark space toward the plasma which is situated directly above the target surface. These ions are then accelerated through the plasma and collide with articles placed directly behind the plasma. Since the substrate is not placed directly behind the plasma, as has traditionally been done, none of these high energy ions contact the substrate surface.

The substrates are mounted to substrate handling means which causes the substrates to be rotated in a planetary manner around the targets. This rotation and movement of the substrates promotes uniformity in the coatings and avoids any irregularities caused by the configuration of the discharge. Furthermore, the substrate handling means has facilities to carry a large number of substrates at one time. This allows for mass fabrication of high quality optical mirrors.

As stated, to produce optical mirrors requires alternating layers of differing materials. The present invention provides a device whereby substrates may be coated with material from a plurality of different targets. The present invention can accomplish this without the handling of the substrates and/or the substitution of different target materials.

The present invention has two alternatively energizable cathodes, each having different target materials on the surface thereof. Therefore, by simply adjusting the substrate handling means to be positioned adjacent to the appropriate target surface, and energizing the attached cathode, sputtering from that target surface can be achieved. Repositioning of the substrate handling means and again energizing the appropriate target can accomplish sputtering from a different target surface, thereby allowing alternating layers of material to be sputtered upon the substrates.

By placing shields between the different sputtering targets, purity of the target surface is maintained, thereby maintaining purity in the thin films sputtered onto the substrates. The shields also protect other portions of the sputtering device from the high energy ions being ejected in a direction perpendicular to the target surface.

BRIEF DESCRIPTION OF THE DRAWINGS

Further objects and advantages of the present invention may be seen by reading the following detailed description of the invention in conjunction with the following drawings in which.

DETAILED DESCRIPTION OF THE INVENTION

Figure 1:
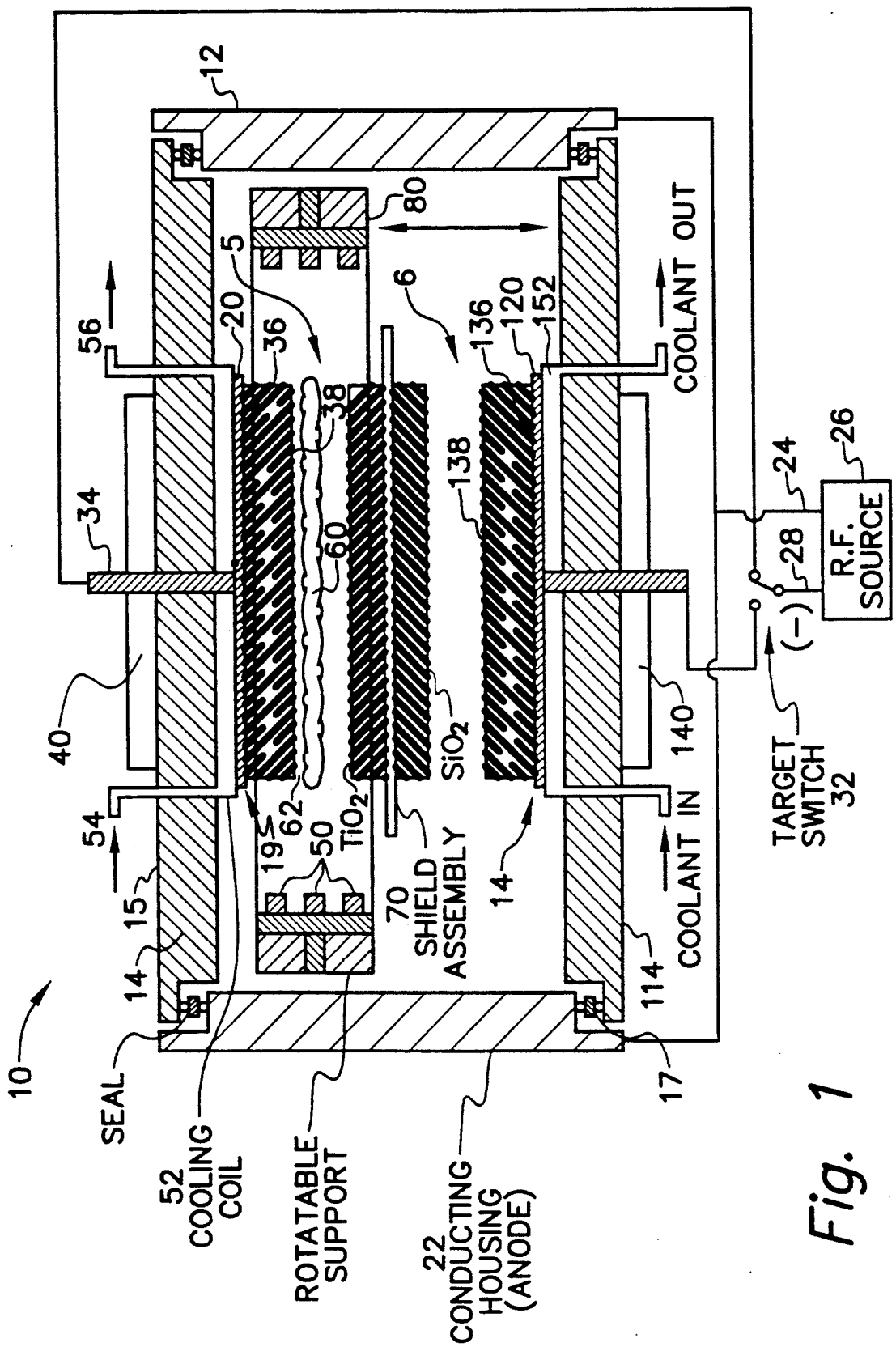
FIG. 1 is a cross sectional diagram of the magnetron sputtering device.
Figure 2:
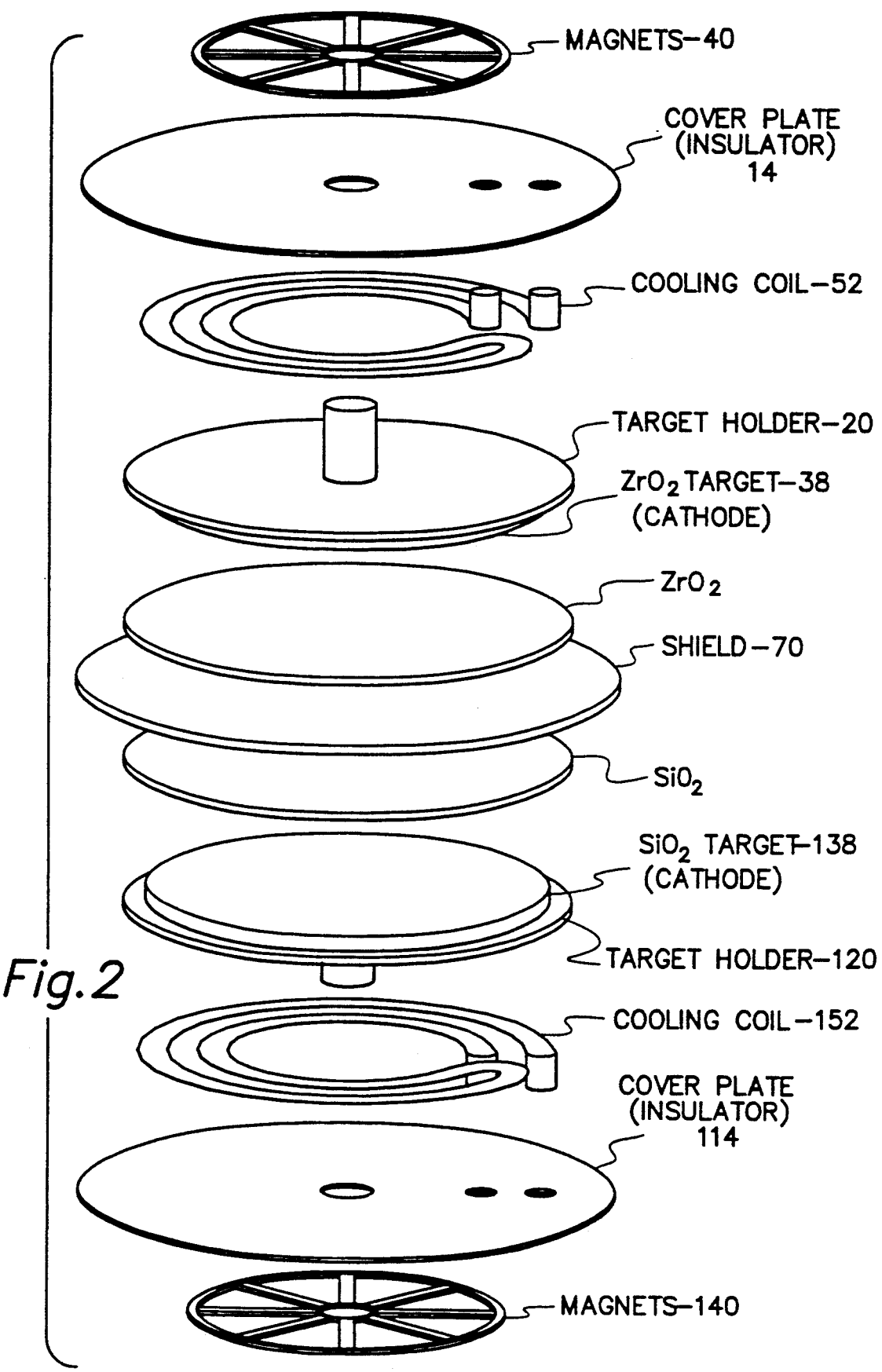
FIG. 2 is an exploded diagram of the magnetron sputtering device showing the separate parts thereof and the relationship between these parts.

Referring to FIG. 1, to maintain a gas discharge, gas is pressurized within a pressure chamber 10. In the present embodiment, pressure chamber 10 comprises a cylindrical outer wall 12 with a first cover 14, and a second cover 114.

In the present invention, material can be sputtered by two separate sputtering devices, 5 & 6. Operation of a first sputtering device 5 will be described with the understanding that the second sputtering device 6 operates similarly. Specific differences in the two sputtering devices will be further explored later in this detailed description.

To apply thin film coatings using magnetron sputter deposition, it is first required to establish a gas discharge within gas chamber 10. This gas discharge is established by applying an electrical potential between a first cathode assembly 19 and an anode 22. In the present embodiment cylindrical outer wall 12 is utilized as an anode 22 by electrically connecting cylindrical outer wall 12 to a positive contact 24 of a radio frequency source 26. A negative contact 28 of radio frequency source 26 is electrically connected to first cathode 20 via a target switch 32. Electrical contact between first cathode assembly 19, which is inside pressure chamber 10, and target switch 32 is made through a conducting post 34 which extends through cover 14. It is important that first cathode assembly 19 be electrically isolated from cover 14, therefore insulators 17 are used to provide this isolation.

First cathode assembly 19 has a first cathode 20 with a first target 38 on a surface 36. Surface 36 is positioned to be exposed to the interior of sputtering chamber 10. Through the magnetron sputter deposition process, particles of first target 38 will be deposited upon a plurality of substrates 50. In the present embodiment first target 38 is made of titanium dioxide ($TiO_2$).

Placed directly behind first cathode 20 and on the exterior side 15 of cover 14 is a magnet assembly 40.

Figure 4:
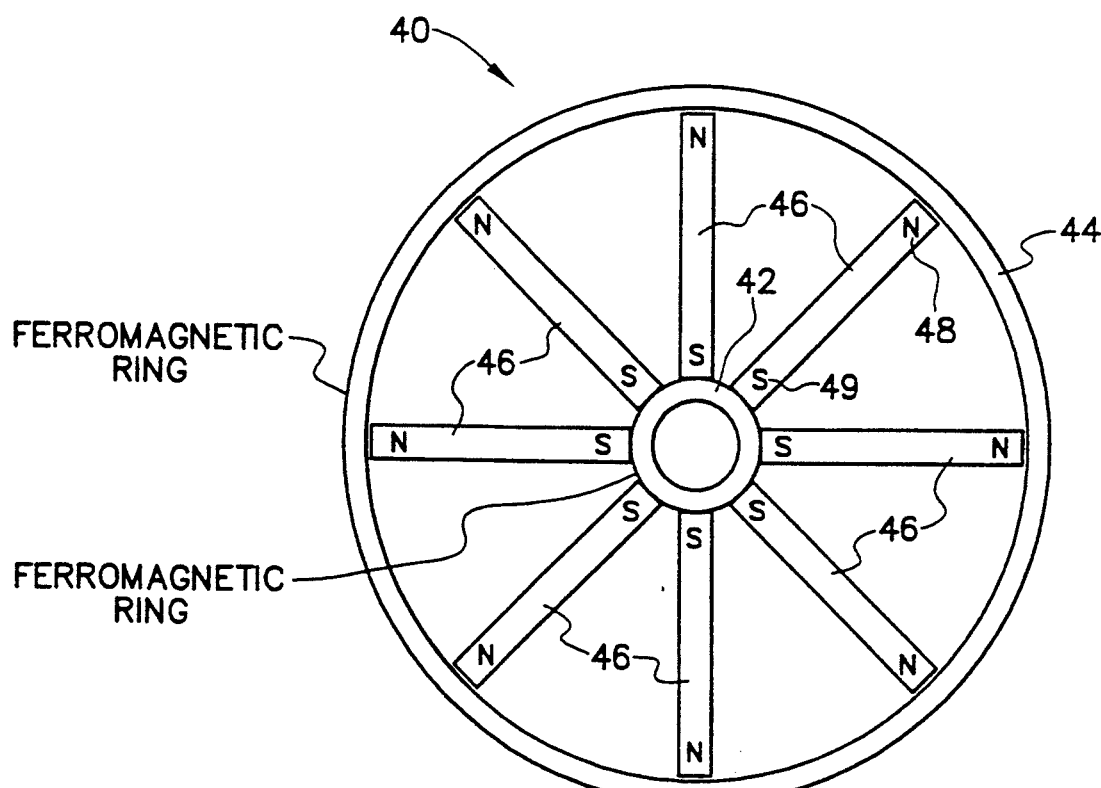
FIG. 4 is a top view of the magnet assembly used in the present invention.

Referring now to FIG. 4, magnet assembly 40 comprises an inner ferromagnetic ring 42, an outer ferromagnetic ring 44 and a plurality of radial magnetic members 46.

The polarity of magnetic members 46 causes lines of magnetic force to leave magnetic member 46 from a north pole 48 and return to magnetic member 46 at a south pole 49. With magnetic members 46 configured in a spoke like manner, the lines of magnetic force are also configured in a spoke like manner.

Magnetron sputtering devices are widely used for thin film coatings. Typically a gas discharge is established within a gas chamber thus causing positively charged ions to bombard the target surface. The collision of these positively charge ions with the target surface causes particles of the target material to be released from the target material. These particles from the target are then deposited on other structures within the vicinity of the target. Specifically, substrates are placed in close proximity to the target surface thus causing the substrate to be coated with the target material.

Figure 5:
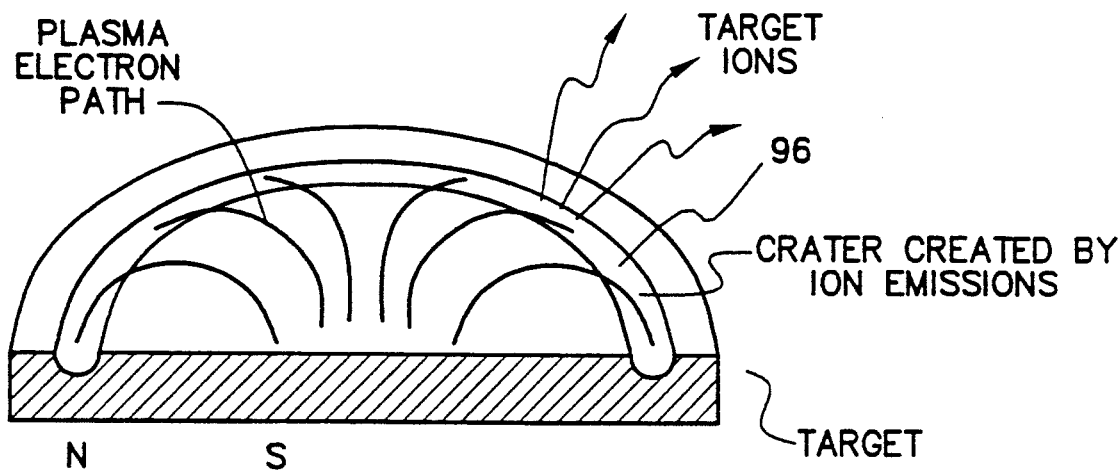
FIG. 5 is a prospective view of an operational target showing the magnetic lines created by the magnetic assembly and the depletion of the target surface.

The magnetic field created by magnet assembly 40 acts to concentrate the majority of target sputtering. Most sputtering will occur in regions similar to the magnetic geometries. With magnet assembly 40 configured as shown in FIG. 4, a "race track" 96 is formed around the periphery of the target. Referring to FIG. 5, a majority of target sputtering will occur in this "race track" region 96. By configuring magnet assembly differently any desired pattern can be achieved where a majority of the sputtering will occur.

Referring again to FIG. 1, as the result of the gas discharge a plasma 60 is formed within pressure chamber 10. Plasma 60 is made up of a collection of electrons and ions and generally has a overall positive charge. Plasma 60 is located a slight distance above first target 38. The magnetic forces from magnet assembly 40 causes the plasma to stay within a certain defined region.

Between the surface of first target 38 and plasma 60 is a dark space 62. During sputtering negatively charged ions can be released from first target 38. Due to the positively charged plasma 60 positioned a slight distances from the surface of target 38, these negatively charged ions are caused to be accelerated across dark space 62 and through the plasma. These negatively charged ions thus collide with any objects placed directly behind plasma 60. Due to the very large amount of energy the negatively charged ions have after they have been accelerated through plasma 60, they can cause destruction to any surface with which they may collide. In particular, many oxide target compounds form negative oxygen ions during sputtering.

In the present embodiment a shield assembly 70 is placed directly behind plasma 60, in parallel with first target 38. This shield is positioned to receive the high energy ions that are accelerated across dark space 62 and through plasma 60. Shield assembly 70 is composed of target material to avoid any substrate contamination during sputtering. As previously mentioned, should the substrates 50 be placed directly behind the plasma the high energy negatively charged ions, released from the target surface, would cause destruction to the uniformity of the thin film surface deposited upon the substrates. When sputtering is used to make mirrors, this destruction can result in mirrors with high scatter and high absorption.

In addition to the negatively charged ions a large number of neutral ions are released from the target surface when a gas discharge is established. These neutral ions are deposited on any elements in proximity to the target surface. Typically, the distribution of these neutral ions is in a sine squared pattern.

Referring again to FIG. 1, substrates 50 are mounted adjacent to first target 36 on a substrate handling means 80. Substrates 50 are then positioned within this sine squared area while not being directly behind the plasma and not being exposed to the previously mentioned highly destructive ions. As would be expected, the deposition rate at which material is deposited on the substrates 50 is much lower in this position than if the substrates where positioned directly opposite first target 38. However, since substrates 50 are not exposed to high energy ions from first target 38 the uniformity and the quality of the coating on substrates 50 is vastly improved. The already low deposition rate can be changed by altering pressure at which sputtering is done. As previously mentioned, sputtering occurs within pressure chamber 10. The pressure at which sputtering is performed will effect the rate of deposition on substrates 50 because the gas within pressure chamber 10 provides resistance to particles ejected from targets 38. If the pressure within the chamber is reduced, there are fewer gas particles within the chamber, thus less resistance to particles sputtered from target 38. Therefore a lower pressure can help to increase the deposition rate.

During operation cathode 20 is typically heated to a very high temperature. To help reduce the temperature of cathode 20 a cooling coil 52 is placed directly behind first cathode 20. This cooling coil has an inlet 54 and a cooling outlet 56 to allow coolant to flow there through.

Figure 3:
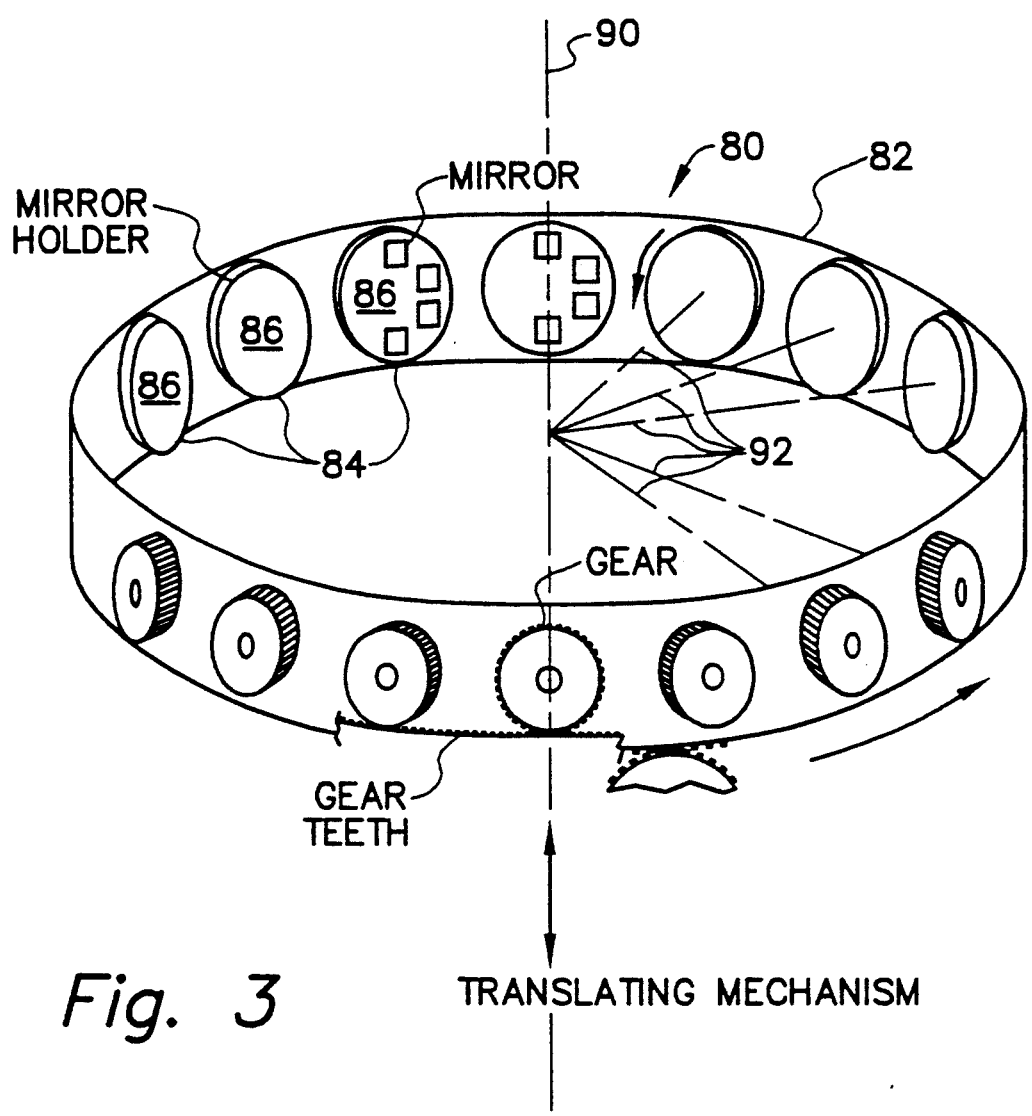
FIG. 3 is a perspective view of the substrate handling means.

Referring now to FIG. 3, substrate handling means 80 is capable of handling a plurality of substrates and rotating them in a planetary manner to promote uniformity of the coatings thereon. Substrate handling means 80 has a holding ring 82 and a plurality of substrate holders 84. Substrates 50 are mounted on an inwardly facing surface 86 of substrate holders 84. Holding ring 82 is caused to be rotated about a central axis 90. While holding ring 82 is rotated about central axis 90, each substrate holder 84 is rotated about a radial axis 92. This planetary motion of substrates 50 promotes uniformity in the coating thereof.

In order to increase the efficiency and quality of sputtering, the substrates could be electrically biased so as to attract particles from first target 38. The bias level should be relatively low however to avoid the generation of high energy collisions between substrates 50 and sputtered particles.

As previously mentioned the present invention is capable of sputtering from two different targets. Referring again to FIG. 1, a second cathode assembly 119 is situated close to second cover 114. Again, second cover 114 is insulated from cylindrical wall 12 by an insulator 117. Second cathode assembly 119 is electrically connected to RF source 26 through target switch 32. It will be noted that target switch 32 is a single pole double throw switch, capable of energizing either first cathode assembly 19 or second cathode assembly 119. As with first cathode assembly 19, second cathode assembly 119 has a second cathode 120 with a second target 138 attached thereto. Mounted on the interior surface 136 of second cathode 120 is second target 138. In this embodiment, second target 138 is made of silicon dioxide (SiO$_2$). Located directly behind second cathode 120 is a second cooling coil 152. Also, located behind second cathode 120 and on an exterior surface 115 of second cover 114 is a second magnet assembly 140. Second magnet assembly 140 is configured identical to first magnet assembly 40. It should also be noticed that second target 138 and second cathode 120 are positioned such that second target 138 is parallel to shield assembly 70 as was first target 38 and first cathode 20.

It should be understood that first cathode 20 and first target 38 could be constructed as a single piece. Also, first target 38 may simply be a thin layer of material upon the surface 36 of first cathode 20. Alternatively, first cathode 20 and first target 38 could be separate pieces. The same is true for second cathode 120 and second target 138.

To sputter material onto substrate 50 from second target 138 substrate handling means 80 must be repositioned to be adjacent to second target 138. This is accomplished by a translating means (not shown) capable of moving substrate handling means 80 from a first position, adjacent to first target 38, to a second position, adjacent to second target 138. To sputter from second target 138 the target switch 32 must be moved to a position that allows second cathode 120 to be energized.

Sputtering from second target 138 is identical in operation to sputtering from first target 38.

It will be understood that only a single target assembly would be needed if it was desired that only one material be coated upon the substrates. Uniformity of coating will still be enhanced by rotation of substrates 50 about the target as previously described.

Having illustrated and described the principles of the invention in the preferred embodiment it should be apparent to those skilled in the art that the invention can be modified in arrangement and detail without departing from such principles. We claim all modifications coming within the spirit and scope of the following claims.

What is claimed is:

1. An off-axis magnetron sputtering device for use in the construction of mirrors by sputtering a combination of alternating layers of material on a substrate surface a substrate, comprising:

an air tight sputtering chamber capable of maintaining gas at a pressure required to establish a discharge having a substantially cylindrical outer wall and a first and a second cover perpendicular to a central axis of said cylindrical outer wall;

a first cathode assembly disposed within said chamber in close proximity to said first cover, said first cathode assembly having a first target material on a first target surface of said first cathode assembly, said first target surface opposite said first cover, and perpendicular to said central axis;

a second cathode assembly disposed within said chamber in close proximity to said second cover of said chamber having a second target material on a second target surface of said second cathode assembly, said second target surface being opposite said second cover and parallel to said first target surface;

a sputter shield disposed between said first cathode assembly and said second cathode assembly, said sputter shield having said first target material on a surface facing said first cathode assembly and said second target material on a surface facing said second cathode assembly;

a first magnet assembly situated behind said first cathode assembly and opposite said first target surface, said magnet assembly having lines of magnetic force that leave said first target surface and return to said first target surface;

a second magnet assembly situated behind said second cathode assembly and opposite said target surface, said second magnet assembly having lines of magnetic force that leave said second target surface and return to said second target surface;

a switchable radio frequency source having one contact connected to said chamber and a second contact switchably connected to either said first cathode assembly or said second cathode assembly; and substrate handling means for holding a plurality of substrates in an orientation such that the substrate surface to be coated is parallel with said central axis and such that a radial vector normal to said substrate surface perpendicularly intersects said central axis, said substrate handling means for causing the substrates to be rotated about said cathode assemblies, said substrate handling means also for positioning said substrates in one of a plurality of positions, a first position being such that a radial vector normal to said substrate surface perpendicularly intersects said central axis between said first cathode assembly and said sputtering shield, and a second position being such that a radial vector normal to said substrate surface perpendicularly intersects said central axis between said second cathode assembly and said sputtering shield.

2. The off-axis magnetron sputtering device of claim 1 wherein said substrate handling means has first rotation means for causing said substrates to be rotated about said central axis.

3. The off-axis magnetron sputtering device of claim 2 wherein said substrate handling means has second rotation means for causing said substrates to be rotated about an axis perpendicular to said substrate surface.

4. The off-axis magnetron sputtering device of claim 1 wherein the substrate handling means is electrically biased at a predetermined bias voltage.

5. The off-axis sputtering device of claim 1 wherein the air tight sputtering chamber is capable of varying the pressure of the gas therein so as to increase the rate of deposition.

6. An off-axis magnetron sputtering device for use in the fabrication of mirrors by sputtering alternating layers of material onto a surface of a substrate, comprising:

an air tight sputtering chamber of maintaining gas at a pressure required to establish a discharge;

a first magnetron sputtering device within said chamber having a first target with a planar first target surface facing the interior of said chamber and magnetic means positioned behind said planar first target surface, said magnetic means for causing lines of magnetic force to leave said planar first target surface and subsequently return to said planar first target surface;

a second magnetron sputtering device within said chamber having a second target with a planar second target surface facing the interior of said chamber and magnetic means positioned behind said planar second target surface, said planar second target surface being parallel to and facing said planar first target surface, said magnetic means for causing lines of magnetic force to leave said planar second target surface and subsequently return to said planar second target surface;

a sputtering shield between said first magnetron sputtering device and said second magnetron sputtering device, said sputtering shield having a first surface parallel to and facing said first magnetron sputtering device and a second surface parallel to and facing said second magnetron sputtering device;

substrate handling means for positioning a substrate such that a surface of said substrate is perpendicular to said sputtering shield and for moving said substrate between a first position which is adjacent to said first magnetron sputtering device and a second position which is adjacent to said second magnetron sputtering device, said substrate handling means further for rotating said substrate about a first axis normal to said substrate surface and parallel with said sputtering shield, and for concurrently rotating said substrate about an axis that intersects and is perpendicular to said sputtering shield.

7. The off-axis magnetron sputtering device of claim 6 further comprising a switchable radio frequency source having one contact connected to said chamber and a second contact switchable connected to either said first magnetron sputtering device or said second magnetron sputtering device.

8. The off-axis magnetron sputtering device of claim 7 wherein said first magnetron sputtering device has a cathode connected to said switchable radio frequency source, said cathode positioned between said first target and said magnetic means.

9. The off-axis magnetron sputtering device of claim 7 wherein said second magnetron sputtering device has a cathode connected to said switchable radio frequency source, said cathode positioned between said second target and said magnetic means.

10. The off-axis magnetron sputtering device of claim 6 wherein said planar first target surface is circular.

11. The off-axis magnetron sputtering device of claim 10 wherein said magnetic means cause said lines of magnetic force to leave said planar first target surface from a center portion and extend radially outward until said lines return to said planar first target surface at an outer portion.

12. The off-axis magnetron sputtering device of claim 6 wherein said planar second target surface is circular.

13. The off-axis magnetron sputtering device of claim 12 wherein said magnetic means causes said lines of magnetic force to leave said planar second target surface from a center portion and extend radially outward until said lines return to said planar second target surface at an outer portion.

14. The off-axis magnetron sputtering device of claim 6 wherein said sputtering shield has first target material on a surface parallel to and facing said planar first target surface, and said sputtering shield has second target material on a surface parallel to and facing said planar second target surface.

15. The off-axis sputtering device of claim 6 wherein the air tight sputtering chamber is capable of varying the pressure of the gas therein so as to increase the rate of deposition.

16. The off-axis magnetron sputtering device of claim 6 wherein the substrate handling means is electrically biased at a predetermined bias voltage.

17. An off-axis magnetron sputtering device for use in the fabrication of mirrors by sputtering alternating layers of material onto a surface of a substrate, comprising:

an air tight sputtering chamber capable of maintaining gas at a pressure required to establish a discharge;

a first magnetron sputtering means within said chamber having a first target with a planar first target surface facing the interior of said chamber and magnetic means positioned behind said planar first target surface, said first magnetron sputtering means for sputtering materials from said planar first target surface onto a plurality of substrates, said magnetic means for causing lines of magnetic force to leave said planar first target surface and subsequently return to said planar first target surface;

a second magnetron sputtering means within said chamber having a second target with a planar second target surface facing the interior of said chamber and magnetic means positioned behind said planar second target surface, said planar second target surface being parallel to and facing said planar first target surface, said second magnetron sputtering means for sputtering materials from said planar second target surface onto said plurality of substrates, said magnetic means for causing lines of magnetic force to leave said planar second target surface and subsequently return to said planar second target surface;

a sputtering shield between said first magnetron sputtering means and said second magnetron sputtering means, said sputtering shield having a first surface parallel to and facing said first magnetron sputtering means and a second surface parallel to and facing said second magnetron sputtering means; and substrate handling means for positioning a substrate such that a surface is perpendicular to said sputtering shield and for moving said substrate between a first position which is adjacent to said first magnetron sputtering device and a second position which is adjacent to said second magnetron sputtering device.

18. The magnetron sputtering device of claim 17 wherein said substrate handling means is an annular member having means for rotating said substrate about a radial axis normal to said substrate surface and parallel with said sputtering shield, and for concurrently rotating said substrate about an axis that intersects and is perpendicular to said sputtering shield.

19. The magnetron sputtering device of claim 17 wherein said first magnetron sputtering means comprises:

a source of radio frequency potential having a first and a second contact, wherein said first contact is electrically connected to said chamber;

a cathode positioned behind said first target, said cathode electrically connected to said second contact of said source.

20. The magnetron sputtering device of claim 17 wherein said second magnetron sputtering means comprises:

a source of radio frequency potential having a first and a second contact, wherein said first contact is electrically connected to said chamber;

a cathode positioned behind said second target, said cathode electrically connected to said second contact of said source.

21. A method of coating a substrate with a plurality of thin films, comprising the steps of:

a. positioning a substrate adjacent to a first cathode such that said substrate is perpendicular to a first target surface of said first cathode, said first cathode and said substrate both being located within a gas filled chamber;

b. applying an electrical potential between said first cathode and said gas filled chamber creating a gas discharge within said gas filled chamber and thereby causing sputtering of material from said first target surface onto said substrate, and rotating said substrate about an axis which is perpendicular to said first target surface and concurrently rotating said substrate about an axis which is normal to the surface of said substrate;

c. repositioning said substrate adjacent to a second cathode such that said substrate is perpendicular to a second target surface of said second cathode, said second cathode and said substrate both being located within a gas filled chamber;

d. applying an electrical potential between said second cathode and said gas filled chamber creating a gas discharge within said gas filled chamber and thereby causing sputtering of material from said second target surface onto said substrate, and concurrently rotating said substrate about an axis which is perpendicular to said second target surface and while also rotating said substrate about an axis which is normal to a surface of said substrate.

* * * * *